United States Patent
Vashchenko et al.

(10) Patent No.: US 6,841,829 B1
(45) Date of Patent: Jan. 11, 2005

(54) SELF PROTECTING BIPOLAR SCR

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/436,559

(22) Filed: May 12, 2003

(51) Int. Cl.[7] .......................... H01L 23/62; H01L 29/00
(52) U.S. Cl. ..................................... 257/362; 257/560
(58) Field of Search ............................. 257/361, 362, 257/560, 561, 562, 578

(56) References Cited

U.S. PATENT DOCUMENTS

| | | | |
|---|---|---|---|
| 5,811,856 A | * | 9/1998 | Lee .......................... 257/355 |
| 6,285,062 B1 | * | 9/2001 | Marr .......................... 257/361 |
| 6,559,509 B1 | * | 5/2003 | Hatano et al. .............. 257/362 |
| 6,713,816 B1 | * | 3/2004 | Wolf et al. ................. 257/355 |

* cited by examiner

Primary Examiner—Ngân V. Ngô
(74) Attorney, Agent, or Firm—Jurgen Vollrath

(57) ABSTRACT

In a BSCR and method of making a BSCR, a npn BJT structure is created and a p+ region is provided that is connected to the collector of the BJT, and one or more of the NBL, sinker and n+ collector of the BJT are partially blocked. In this way the NBL is formed into a comb-like NBL with a plurality of tines in one embodiment. The sinker and n+ collector may also be formed into a plurality islands. Furthermore, the period of the tines and islands may be varied to provide the desired BSCR characteristics.

7 Claims, 4 Drawing Sheets

SELF PROTECTING BIPOLAR SCR

FIELD OF THE INVENTION

The invention relates to ESD self-protecting device for use in BiCMOS circuits. In particular it relates to Bipolar SCR structures.

BACKGROUND OF THE INVENTION

Integrated circuit devices typically display sensitivity to electrostatic discharge (ESD) events thus making it necessary to take measures to protect these circuits. The I/O circuits may be self-protecting by making them more robust so as to be capable of handling the high ESD currents.

In the case of BiCMOS technology, self-protecting I/O circuits are commonly implemented as BJT structures. A typical BJT structure is shown in FIGS. 1 and 2. In FIG. 1, the npn BJT 100 is shown in cross-section to show the p-base 102 formed in a p-substrate 104. The collector 106, comprising n+ region 108, n− sinker 110, and n-buried layer (NBL) 112, is also formed in the p-substrate 104. The BJT 100, further, includes an emitter 114 in the form of a polysilicon region. FIG. 1 also shows two base contacts 120 and a collector contact 122 Shallow trench isolation (STI) regions 130, 132 isolate the device from other devices and STI 134 separates the collector 106 from the emitter 114 to limit junction breakdown. It will be appreciated that process variations may result in slight structural variations in defining the emitter, base and collector regions.

While BJTs provide the necessary drive for the output circuit during normal operation, and snapback under ESD conditions, they do not necessarily trigger at the desired voltage during snapback.

The major alternative to BJTs is the use of SCR-like structures, which display higher ESD efficiency. In order to incorporate SCR characteristics into a BJT structure, a p+ region 350 acting as an SCR emitter, is included in the BJT structure to define a Bipolar SCR as shown in FIGS. 3 and 4. The structure remains pretty much the same as the BJT shown in FIGS. 1 and 2, with p-base 302 formed in a p-substrate 304. The collector 306, comprising n+ region 308, n− sinker 310, and n-buried layer (NBL) 312, is also formed in the p-substrate 304. The Bipolar SCR structure 300 also includes an emitter 314 in the form of a polysilicon region. It also includes two base contacts 320 and a collector contact 322. Shallow trench isolation (STI) regions 330, 332 isolate the device from other devices and STI 334 separates the BJT collector 306 from the BJT emitter 314. The SCR emitter 350, which has been added, is contacted by a contact 352, which is shown in FIG. 3 and is connected to the contact 322 of the collector 306. The device of FIGS. 3 and 4 provides for two stage triggering operation. Initially the BJT structure is triggered after avalanche breakdown of the blocking junction. This results in a high avalanche injection current which biases the p+ region 350, thereby paving the way for the injection of holes and the creation of a high density electron-hole plasma. This reduces the electric field below the breakdown level.

However, for high speed devices such as certain Si—Ge BiCMOS devices, the Bipolar SCR (BSCR) discussed above, cannot be used. These high speed devices have a thin epitaxial layer (of the order of 0.5 $\mu$m) to reduce collector resistance and thus the transient time at high frequencies such as microwave. The epitaxial layer is grown on top of the n-buried layer (NBL), and forms the medium on which and in which subsequent regions are formed In order to define the emitter 314, the shallow trench isolation region 334 is formed, which extends substantially to the depth of the epitaxial region. This provides good collector isolation from lateral current transport and is necessary to support with the high speed requirements. As a result, any p+ region on the anode side (such as the p+ region 350) becomes very well isolated since the STI between anode and cathode (STI 334 in FIG. 3), which is a necessary part of the emitter self-align process, extends to or below the level of the shallow NBL. The isolation of the p+ region essentially has the effect of eliminating it from the functionality of the device, which therefore behaves simply as a BJT.

The present invention provides a structure and method for providing a BSCR that is useable for high speed and other shallow NBL devices.

SUMMARY OF THE INVENTION

The invention relates to a BSCR in which one or more of the NBL, sinker, and n+ collector are partially masked. The BSCR typically comprises a BJT structure with an emitter, base, and collector, to which a p+ region has been added on the anode side. The collector may include a n+ collector region, a sinker and a n-buried layer (NBL). The n+ collector and p+ region may be contacted by a common contact. In embodiments where the n+ collector region and sinker are partially blocked to define a plurality of islands, the p+ region may be formed as a plurality of p+ islands interspersed between the n+ collector/sinker islands.

According to the invention, there is provided an ESD protection structure, comprising a n-type collector, a p-type base, an n-type emitter, and at least one p+ region connected to the collector, wherein the collector includes a comb-like n-buried layer. The collector typically also includes a n+ collector and a sinker. The n+ collector and sinker may be configured as a plurality of n+ collector/sinker islands. The p+ region may comprise a plurality of p+ regions interspersed between the n+ collector/sinker islands.

Further, according to the invention, there is provided a method of forming a BSCR, comprising providing a BJT structure with a collector defining an anode, a base, and an emitter defining a cathode, and providing at least one p+ region connected to the anode, wherein providing the collector includes providing a n+ collector, a sinker and a NBL, and wherein at least one of the n+ collector, sinker and NBL is partially blocked. The n+ collector and sinker may be partially blocked to form a plurality of n+collector/sinker islands, and the at least one p+ region may be formed as a plurality of p+regions interspersed between the n+ collector/sinker islands. The method may further include varying the relative widths of the p+ regions and n+ collector/sinker islands thereby varying the period of the p+ regions. Furthermore the NBL may be partially blocked to define a comb-like structure. The widths of the NBL regions and blocked regions may be varied to vary the period of the comb-like structure.

DETAILED DESCRIPTION OF THE INVENTION

Experimental results have shown that in some Bipolar Silicon Controlled Recifier (BSCR) devices in which the n-buried layer (NBL) is shallow and the epitaxial layer is thin, such as certain high speed, Si—Ge devices, the isolation of the added p+ region on the anode side of the device, becomes ineffective. The device simply acts like a BJT. Eliminating the n-buried layer (NBL) in order to regain the SCR characteristics, in turn results in the BJT characteristics being lost. The present invention, instead provides for a partially blocked NBL. In other embodiments, as will be discussed further below, one or more of the other regions constituting the collector were partially blocked. Thus one or more of the n+ collector, sinker and NBL were partially blocked. Where the NBL was partially blocked it resulted in a comb-like structure. In the case of partial blocking of the n+ collector and sinker, n+ collector/sinker islands were created.

Partially blocking the NBL has the effect of creating a comb-like NBL. It was found that by increasing the width of the NBL regions relative to the blocked regions, the BJT characteristics were enhanced due to the lower resistance, while reducing widths of the NBL regions, enhanced the SCR characteristics. Thus the present invention also contemplates determining the desired characteristics and then using simulation results to determine the relative widths of the NBL regions compared to the blocked regions. In other words, the present invention also includes manipulating the period of the NBL, and for that matter, the n+ collector/sinker islands, to achieve the desired characteristics.

Figure 1:
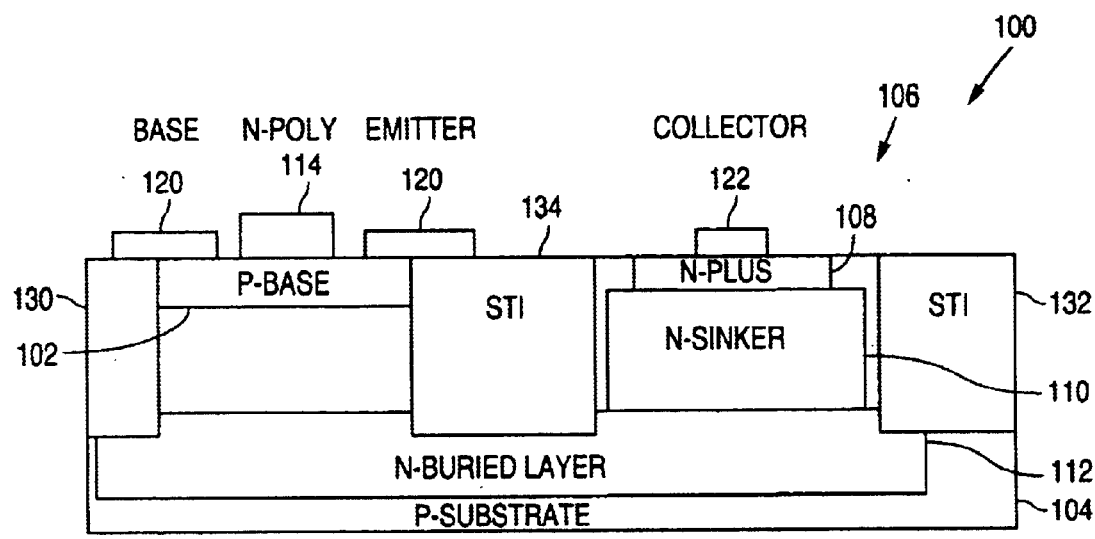
FIG. 1 shows a cross section through a typical prior art BJT structure.
Figure 2:
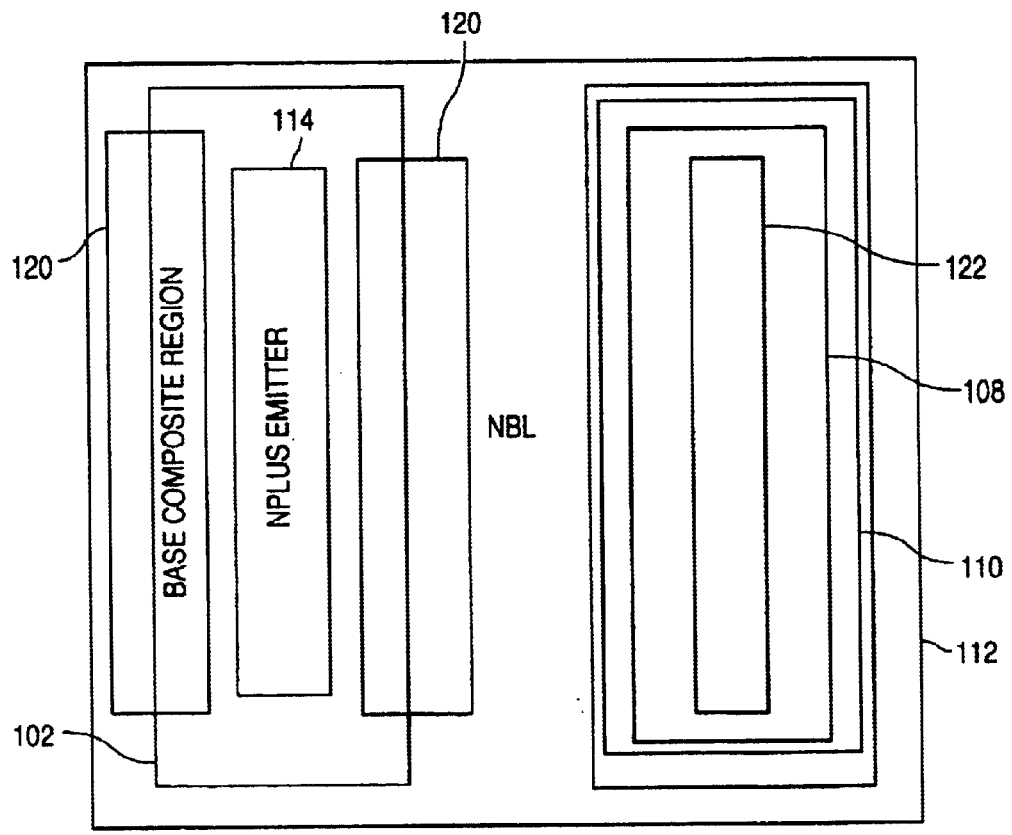
FIG. 2 shows a plan view of part of the structure of FIG. 1.
Figure 3:
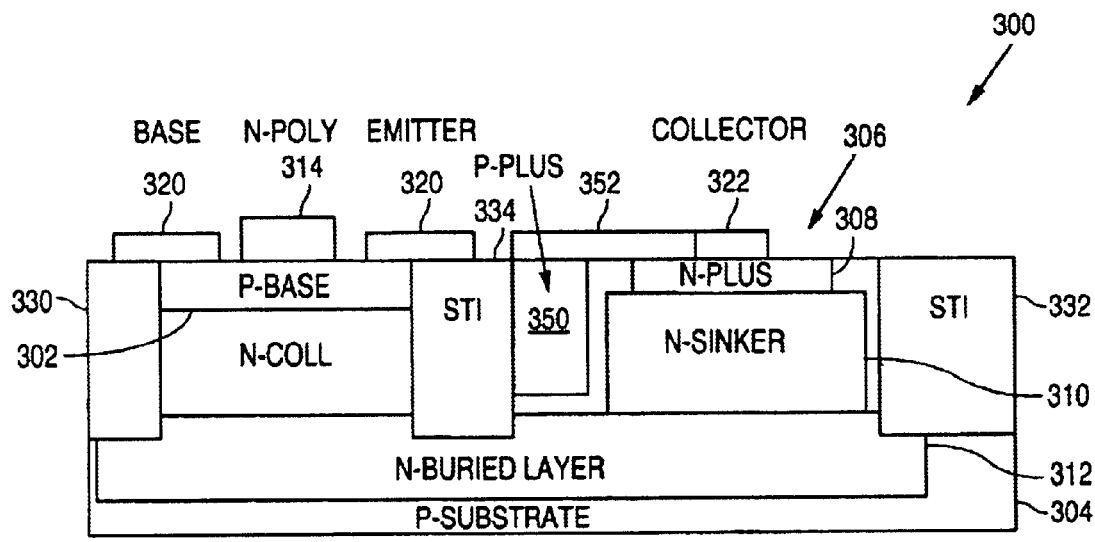
FIG. 3 shows a cross section through a prior art BSCR structure.
Figure 4:
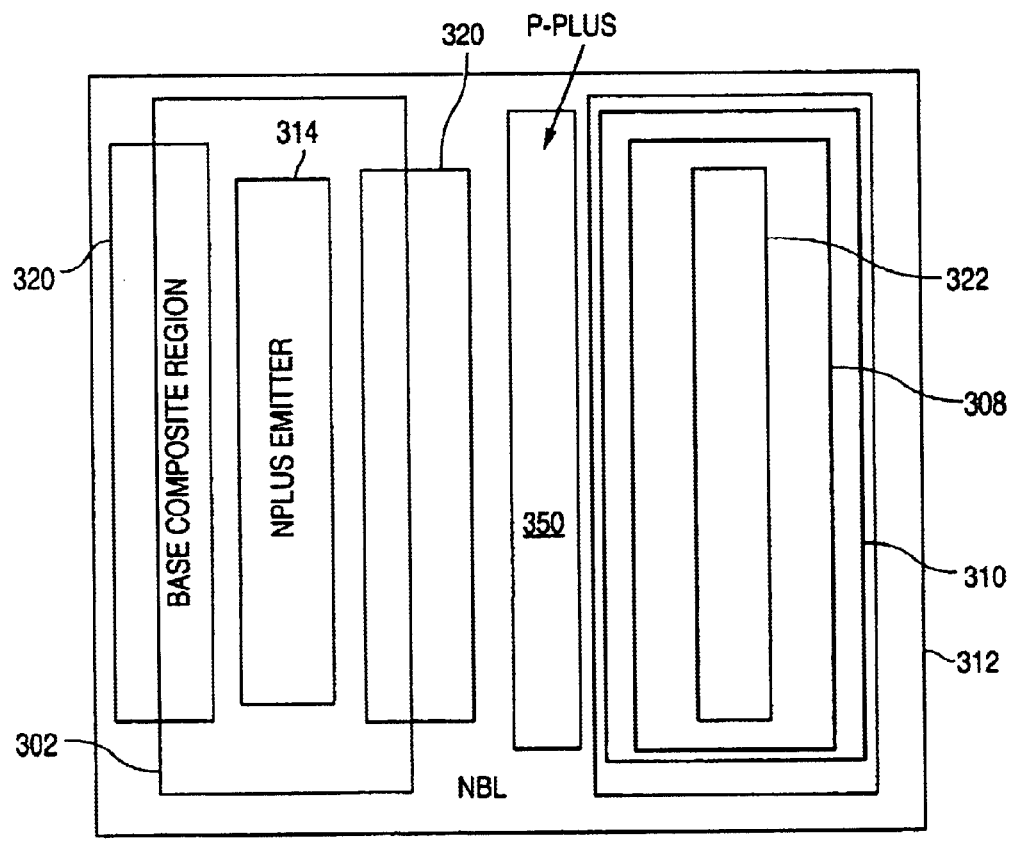
FIG. 4 shows a plan view of part of the BSCR structure of FIG. 3.
Figure 5:
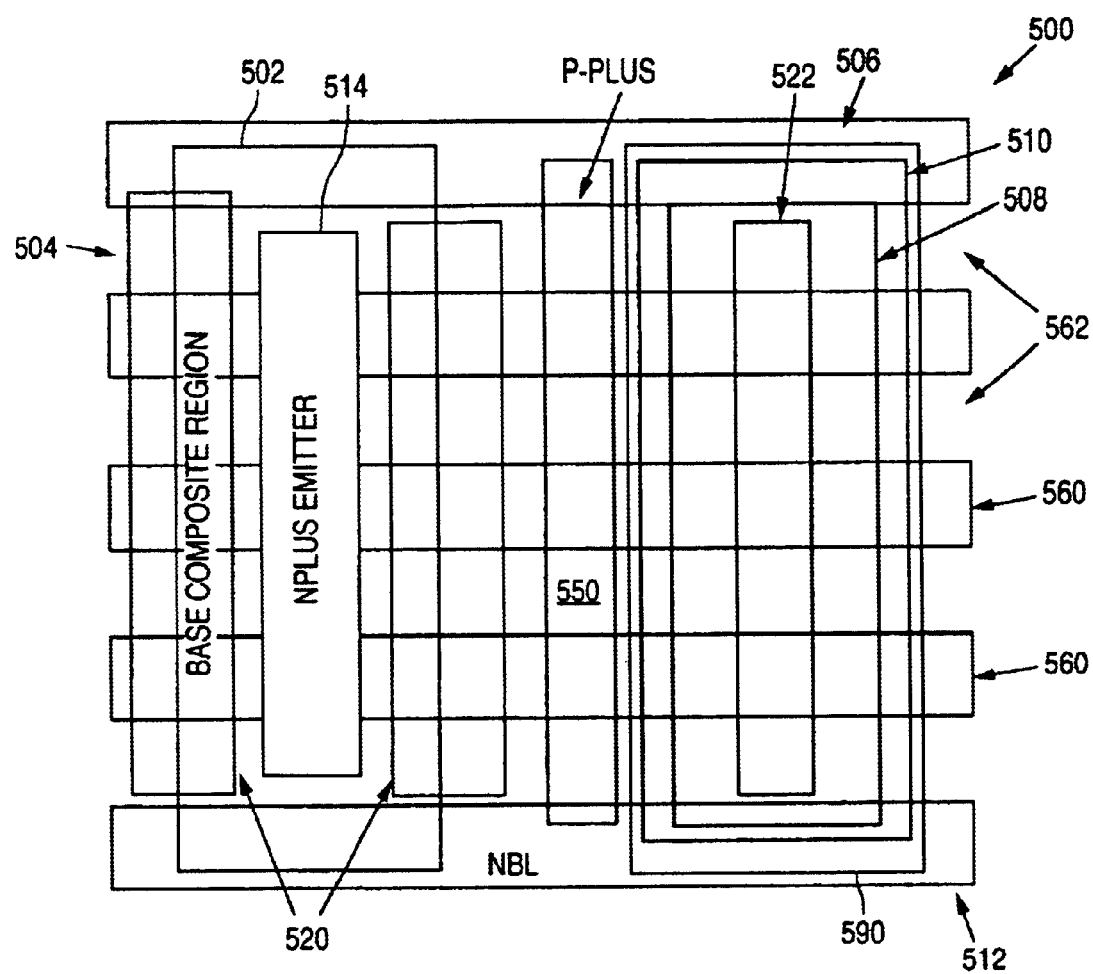
FIG. 5 shows a plan view of one embodiment of a BSCR structure of the invention.

FIG. 5 shows a plan view of one embodiment of the invention. In this embodiment, the BSCR 500 is configured to have a comb-like NBL 512, with the tines 560 of the comb being spaced apart by blocked regions 562. The remaining regions of the BSCR 500 are implemented in a similar fashion as in the prior art structure discussed with respect to FIGS. 3 and 4. Thus, the structure 500 includes a p-base 502 formed in a p-substrate 504. The collector 506, comprising n+ collector 508, n– sinker 510, and the n-buried layer (NBL) 512, is also formed in the p-substrate 504. The Bipolar SCR structure 500 also includes an emitter 514 in the form of a polysilicon region and p+region 550. It also includes two base contacts 520 and a collector contact 522. Shallow trench isolation (STI) regions (not shown) isolate the device from other devices and a STI region (not shown) separates the BJT collector 506 (anode region) from the BJT emitter 514 (cathode region). FIG. 5 also shows the perimeter 590 of the opening in the STI.

The SCR emitter 514 is contacted by a contact (not shown) and is connected to the contact 522 of the collector 506.

Figure 6:
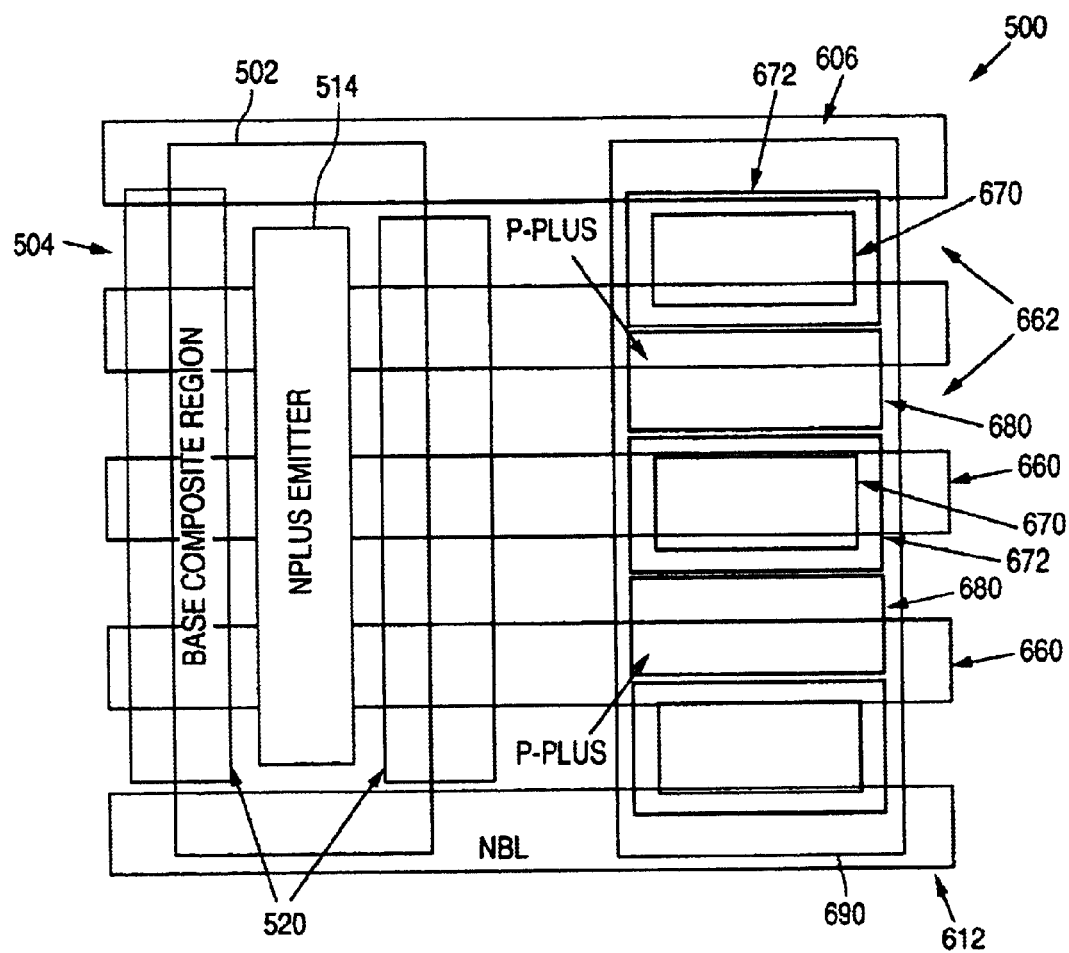
FIG. 6 shows a plan view of another embodiment of a BSCR structure of the invention.

Another embodiment of the invention is shown in FIG. 6. In this embodiment, the NBL 612 is again partially blocked to define a comb-like structure with NBL regions 660 defining the tines of the comb, which are separated by blocked regions 662. In addition, in this embodiment, the n+ collector and sinker are also partially blocked to define n+ collector islands 670 and sinker islands 672. Furthermore, this embodiment, instead of a single p+ region, provides a plurality of p+ regions 680 interspersed between the n+ collector/sinker islands 670, 672, in the blocked regions between the islands 670, 672. Since the remaining regions are substantially the same as in the FIG. 5 embodiment, the same reference numerals have been used for the other regions. No contacts are shown for the cathode 606, and p+ regions 680 but a common contact was used for the cathode 606 and p+ regions 680 in this embodiment. Shallow trench isolation (STI) regions (not shown) isolate the device from other devices and a STI region (not shown) separates the BJT collector 606 (anode region) from the BJT emitter 514 (cathode region). FIG. 6 also shows the perimeter 690 of the opening in the STI.

As mentioned above, the period between the NBL regions 560, 660 can be varied by changing the width and number of blocking regions 562, 662 (see FIGS. 5 and 6). Also, the period of the n+ collector/sinker islands 670, 672 (see FIG. 6) can be varied by changing the number and width of the blocking regions between them. In this way the characteristics of the device can be varied and the desired characteristics provided by making use of simulation results.

While the present invention has been described with respect to specific embodiments, it will be appreciated that different embodiments can be defined without departing from the scope of the invention.

What is claimed is:

1. An ESD protection structure, comprising

A n-type collector,

A p-type base,

An n-type emitter,

At least one p+ region connected to the collector, wherein the collector includes a comb-like n-buried layer.

2. A structure of claim 1, wherein the collector further includes a n+ collector and a sinker.

3. A structure of claim 2, wherein the n+ collector and sinker are configured as a plurality of n+ collector/sinker islands.

4. A structure of claim 3, wherein the at least one p+ region comprises a plurality of p+ regions interspersed between the n+ collector/sinker islands.

5. A BSCR comprising,

A NBL,

A sinker,

A n+ collector, and

At least one p+ region connected to the n+ collector, wherein one or more of the NBL, sinker, n+ collector, and p+ region are partially masked to define multiple regions of the masked NBL, sinker, n+ collector, or p+ region.

6. A BSCR of claim 5, wherein the sinker and n+ collector are both partially blocked to define n+ collector/sinker islands.

7. A BSCR of claim 6, wherein the p+ regions are interspersed between the n+ collector/sinker islands.

* * * * *